United States Patent
Kobayashi

(10) Patent No.: US 7,233,072 B2
(45) Date of Patent: Jun. 19, 2007

(54) ELECTRONIC PART AND SURFACE TREATMENT METHOD OF THE SAME

(75) Inventor: Kenichi Kobayashi, Nagano (JP)

(73) Assignee: Shinei Hi-Tech Co., Ltd., Nagano (JP)

( * ) Notice: Subject to any disclaimer, the term of this patent is extended or adjusted under 35 U.S.C. 154(b) by 0 days.

(21) Appl. No.: 10/986,814

(22) Filed: Nov. 15, 2004

(65) Prior Publication Data

US 2005/0242443 A1 Nov. 3, 2005

(30) Foreign Application Priority Data

Apr. 28, 2004 (JP) ............................. 2004-134101

(51) Int. Cl.
*H01L 29/40* (2006.01)

(52) U.S. Cl. ..................... 257/766; 257/772; 257/781; 257/E23.023

(58) Field of Classification Search ................ 257/737, 257/779, 781, 766, 772, E23.023, 323.025; 438/612–614; 174/263; 29/842, 846
See application file for complete search history.

(56) References Cited

U.S. PATENT DOCUMENTS

| | | | |
|---|---|---|---|
| 6,030,246 A | | 2/2000 | Kunishi |
| 6,072,239 A | * | 6/2000 | Yoneda et al. ............... 257/730 |
| 6,218,031 B1 | * | 4/2001 | Shintani et al. .............. 428/672 |
| 6,352,634 B1 | * | 3/2002 | Forderer et al. ............ 205/181 |
| 2004/0209464 A1 | * | 10/2004 | Sawai et al. ................. 438/678 |

FOREIGN PATENT DOCUMENTS

| | | |
|---|---|---|
| EP | 0 474 499 A2 | 3/1992 |
| JP | 4-193982 | 7/1992 |
| JP | 4-337657 | 11/1992 |
| JP | 2002-111188 A | 4/2002 |

OTHER PUBLICATIONS

Abbott, D., Romm, D., Lange, B., A Nickel-Palladium Integrated Circuit Lead Finish and Its Potential for Solder-Joint Embrittlement, Dec. 2001, Texas Instruments Application Report pp. 1-4□□URL: http://focus.ti.com/lit/an/szza031/szza031.pdf.*
Internet official homepage of Nagano prefecture, Feb. 17, 2003, 15 pp.

* cited by examiner

*Primary Examiner*—Minh-Loan Tran
(74) *Attorney, Agent, or Firm*—Sughrue Mion, PLLC

(57) ABSTRACT

There is provided a surface treatment method for an electronic part, which uses a metal not containing lead and tin and having excellent solder wettability, is economical and has high reliability. In the surface treatment method for the electronic part in which a soldered part is subjected to a surface treatment of structure of three layers of nickel, palladium and gold, the palladium layer and the gold layer are formed by an electrolytic plating treatment, a thickness of the palladium layer is in a range of 0.007 to 0.1 μm, a thickness of the gold layer is in a range of 0.003 to 0.02 μm, and a relation of the thickness of the gold layer<the thickness of the palladium layer is established.

5 Claims, 4 Drawing Sheets

1. JUDGMENT REFERENCE
    JUDGMENT BY ZERO CROSSING TIME OF MENISCOGRAPH METHOD
    ONE SECOND OR LESS: ◯
    ONE TO FIVE SECONDS OR LESS: △
    FIVE SECONDS OR MORE: ✕

2. SAMPLE AND RESULT

| TERMINAL TREATMENT | WITHOUT Au WRAP TREATMENT | WITH Au WRAP TREATMENT |
|---|---|---|
| Ni + Pd · st | △ | ◯ |
| Ni + PS | ◯ | |
| Ni | ✕ | ✕ |
| Ni + Pd/Ni FLASH | △ | |

NOTE: Ni + Pd · st + WITH Au WRAP TREATMENT IS A TREATMENT METHOD OF THE INVENTION

FIG. 7

1. JUDGMENT REFERENCE
    JUDGMENT BY ZERO CROSSING TIME OF MENISCOGRAPH METHOD
        ONE SECOND OR LESS: ○
        ONE TO FIVE SECONDS OR LESS: △
        FIVE SECONDS OR MORE: ✕

2. SAMPLE AND RESULT

|  | Au WRAP PLATING THICKNESS (Å) | | | | |
|---|---|---|---|---|---|
| TERMINAL TREATMENT | 30 | 50 | 100 | 200 | |
| Ni | ✕ | ✕ | ✕ | △ | |
| Ni + Pd · st | ○ | ○ | ○ | ○ | |
| COLOR | Pd COLOR (SILVER COLOR) | | | | Au COLOR |
| TREATMENT CLASSIFICATION | TREATMENT METHOD OF THE INVENTION | | | | Au STRIKE |

NOTE: Ni + Pd · st + WITH Au WRAP TREATMENT IS A TREATMENT METHOD OF THE INVENTION

FIG. 8

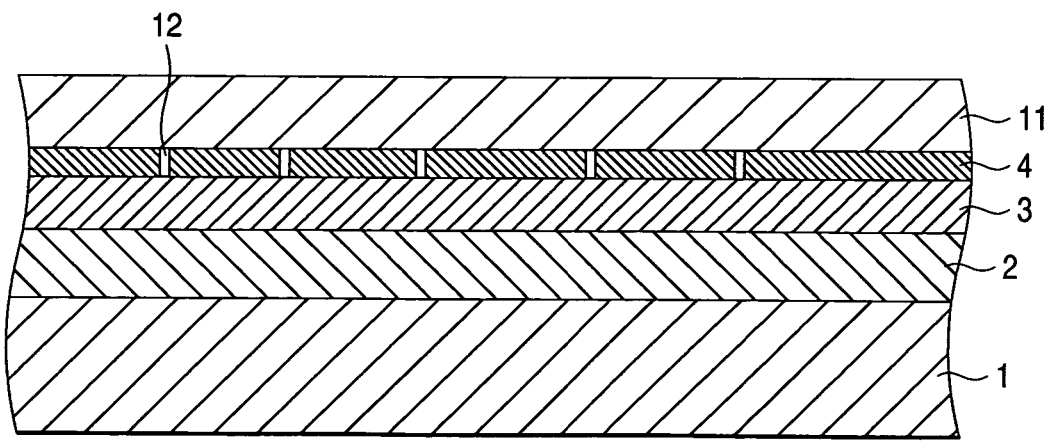

ELECTRONIC PART AND SURFACE TREATMENT METHOD OF THE SAME

BACKGROUND OF THE INVENTION

1. Field of the Invention

The present invention relates to a surface treatment method for an electronic part to be soldered, such as a connection terminal or a metal chassis and a surface treatment method of the same.

2. Description of the Related Art

With the control of lead for environmental protection, a lead-free product is desired, and also in the soldering work of a connection terminal indispensable for an electronic part, a demand for lead-free work is raised.

Conventionally, a connection terminal to be soldered, such as a connector or a lead frame, or a metal chassis (shell) for housing the connection terminal and the like is often subjected to, as a lead-free treatment, a surface treatment using tin with excellent solder wettability. In the case where tin is used, there has been a problem that although the solder wettability is excellent, tin whiskers are apt to be produced, and an electrical short-circuit state is apt to occur.

As an example of this kind of surface treatment method for an electronic part, for example, patent document 1 discloses that in a surface treatment method applied to a soldered area of a wiring layer of a wiring board and using a metal not containing tin, plating using an electroless method is performed on the wiring layer by means of three layers of a nickel layer with an average particle size of 20 nm or more and of 0.5 μm to 5 μm thickness, a palladium or palladium alloy layer of 0.005 μm to 2 μm thickness, and a gold layer of 0.05 μm to 0.8 μm thickness.

[Patent document 1] JP-A-2002-111188 (pages 3 to 5, FIG. 2)

However, as an electronic part to be soldered, such as a connection terminal or a metal chassis, there is desired one which is lead-free, has no whisker, has excellent solder wettability, has excellent corrosion resistance, uses a small amount of gold, and has excellent plating productivity.

In the treatment method of patent document 1, the amount of usage of gold is large, the plating productivity is not excellent, and there is a tendency that cost becomes high. Besides, since the amount of usage of gold is large, there has also been a problem that at the time of soldering of a recent fine pitch product, the concentration of gold in the solder becomes high, and solder strength is lowered.

SUMMARY OF THE INVENTION

The invention has been made to solve the problems as described above, and an object thereof is to provide an electronic part which uses a metal not containing lead and tin and having excellent solder wettability, is economical and has high reliability and a surface treatment method of the same.

According to the invention, an electronic part comprises a soldered part to be soldered, the soldered part being subjected to a surface treatment of structure of three layers of nickel, palladium and gold,
wherein a thickness of the palladium layer is in a range of 0.007 to 0.1 μm, a thickness of the gold layer is in a range of 0.003 to 0.02 μm, and a relation of the thickness of the gold layer<the thickness of the palladium layer is established.

According to the invention, in a surface treatment method for an electronic part in which a soldered part is subjected to a surface treatment of structure of three layers of nickel, palladium and gold, the palladium layer and the gold layer are formed by an electrolytic plating treatment, a thickness of the palladium layer is in a range of 0.007 to 0.1 μm, a thickness of the gold layer is in a range of 0.003 to 0.02 μm, and a relation of the thickness of the gold layer<the thickness of the palladium layer is established.

According to the invention, as described above, since a metal base material of the electronic part to be soldered is sequentially subjected to the surface treatment by nickel plating, palladium strike plating, and gold wrap plating, there is an effect that the electronic part is obtained which is lead-free, has excellent solder wettability, uses a small amount of gold, and is economical.

BRIEF DESCRIPTION OF THE DRAWINGS

FIG. 7 is a view showing test results of solder wettability in a case where the thickness of gold wrap plating of electronic parts according to embodiment 1 of the invention is changed.

FIG. 8 is an explanatory view showing a corrosion-resistant treatment of an electronic part subjected to a surface treatment according to embodiment 2 of the invention.

DETAILED DESCRIPTION OF THE INVENTION

Embodiment 1

Figure 1:
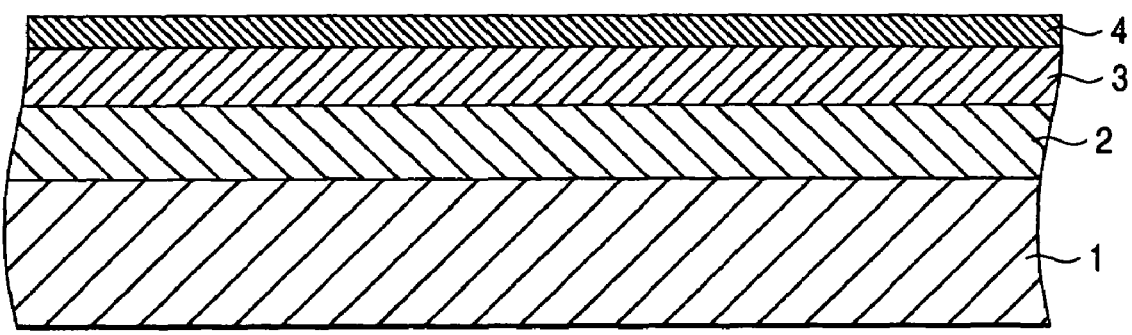
FIG. 1 is an explanatory view showing a surface treatment of an electronic part according to embodiment 1 of the invention.

FIG. 1 is an explanatory view showing a surface treatment of an electronic part according to embodiment 1 of the invention.

In FIG. 1, three layers, that is, a nickel plating 2 (nickel layer), a palladium strike plating 3 (palladium layer), and a gold wrap plating 4 (gold layer) are formed in sequence on a base material 1 made of copper alloy or the like.

Figure 2:
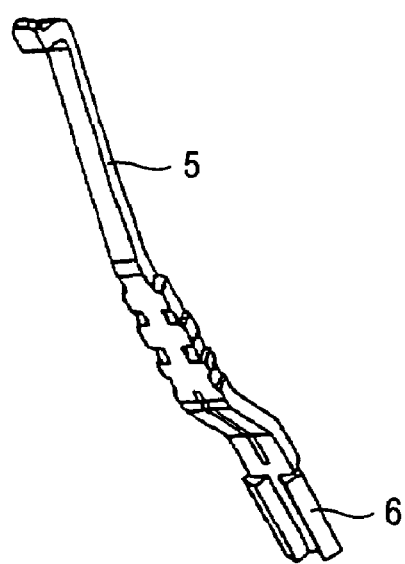
FIG. 2 is an external view showing a connection terminal subjected to the surface treatment according to embodiment 1 of the invention.

FIG. 2 is an external view showing a connection terminal subjected to the surface treatment according to embodiment 1 of the invention.

In FIG. 2, a connection terminal 5 has a soldered part 6.

Figure 3:
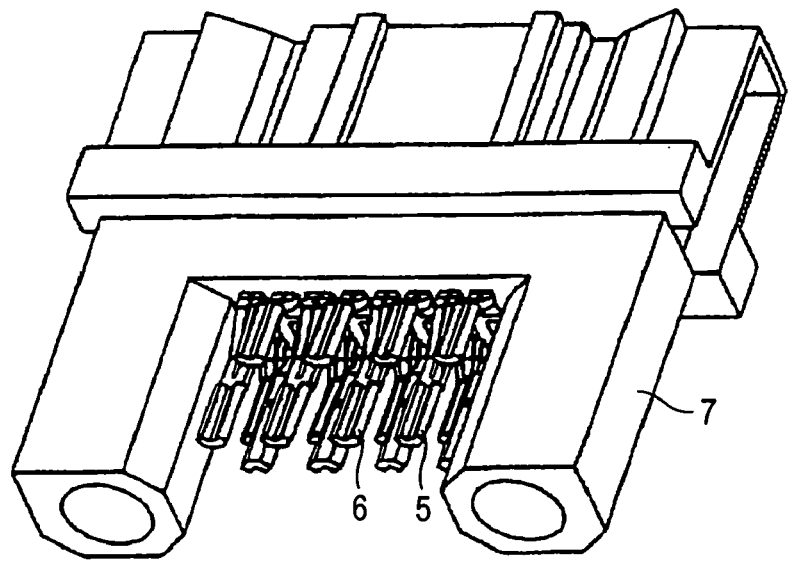
FIG. 3 is an external view showing a connector using a connection terminal subjected to the surface treatment according to embodiment 1 of the invention.

FIG. 3 is an external view showing a connector using a connection terminal subjected to the surface treatment according to embodiment 1 of the invention.

In FIG. 3, connection terminals 5 having soldered parts 6 constitute a connector 7.

Figure 4:
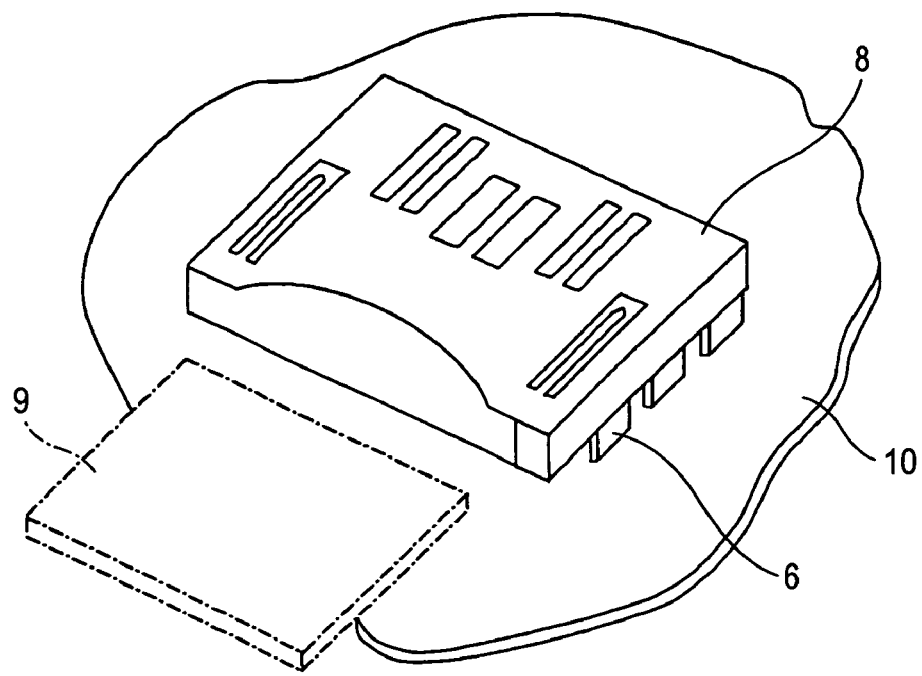
FIG. 4 is an external view showing a metal chassis subjected to the surface treatment according to embodiment 1 of the invention.

FIG. 4 is an external view showing a metal chassis subjected to the surface treatment according to embodiment 1 of the invention.

In FIG. 4, a metal chassis 8 to be soldered is subjected to a three-layer surface treatment as shown in FIG. 1. The non-energized metal chassis 8 is constructed so that a memory card 9 is inserted in the inside, and is soldered to a substrate 10 through a soldered part 6.

Figures 5, 6:
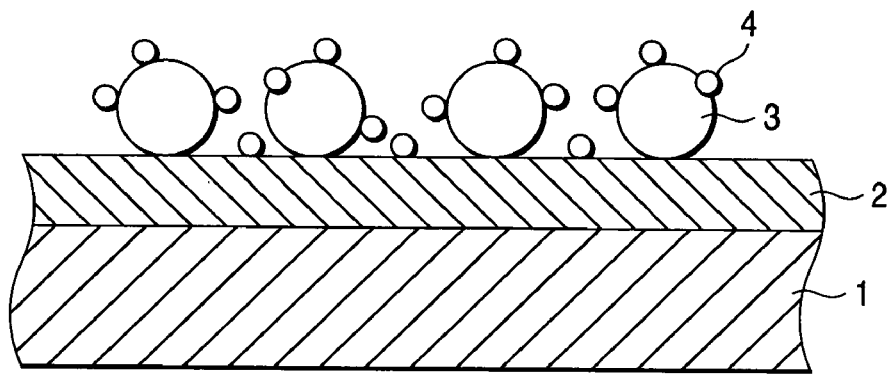
FIG. 5 is a principle view showing the surface treatment of the electronic part according to embodiment 1 of the invention.
FIG. 6 is a view showing test results of solder wettability of electronic parts according to embodiment 1 of the invention.

FIG. 5 is a principle view showing the surface treatment of the electronic part according to embodiment 1 of the invention.

In FIG. 5, reference numerals 1 to 4 denote the same portions as those of FIG. 1. In FIG. 5, the gold wrap plating 4 is formed to partially wrap the surface of the palladium strike plating 3.

FIG. 6 is a view showing test results of solder wettability of electronic parts according to embodiment 1 of the invention.

In FIG. 6, Ni+Pd-st (strike)+Au gold wrap treatment indicates the treatment method of the invention.

FIG. 7 is a view showing test results of solder wettability in a case where the thickness of gold wrap plating of electronic parts according to embodiment 1 of the invention is changed.

In FIG. 7, Ni+Pd-st (strike)+Au gold wrap treatment indicates the treatment method of the invention.

Next, the surface treatment of the connection terminal will be described.

The nickel plating 2 of FIG. 1 is formed to a thickness of 1 to 3 μm so as to cover a base material wiring layer. The palladium strike plating 3 is positioned on the nickel plating 2 and is formed to a thickness of 0.007 to 0.1 μm so as to form nuclei. When the strike coating is thinner than 0.007 μm, the adhesiveness is inferior, and when it is thicker than 0.1 μm, the adhesiveness similarly becomes worse. Thus, the strike coating is formed in the range of 0.007 to 0.1μm in which the adhesiveness is ensured.

Next, the gold wrap plating 4 is formed to a thickness of 0.003 to 0.2 μm. When the thickness of the gold wrap plating is less than the thickness of the palladium strike plating 3, as shown in FIG. 5, the gold wrap plating covers the nuclei of the palladium strike plating 3. In this state, the surface treatment with excellent solder wettability is obtained. In the foregoing thickness of the gold wrap plating 4, a gold color does not come out.

The gold wrap plating 4 protects (against deterioration due to oxidization or the like) the surface of the palladium strike plating 3. Thus, it is necessary that the thickness of the gold wrap plating 4 is 0.003 μm or more so as to cover the nuclei of the palladium strike plating 3. On the other hand, in the case where soldering is performed, first, the gold wrap plating 4 of this protecting portion is diffused into the solder, the clean palladium surface is exposed, and the soldering is performed. At this time, when the plating thickness of the gold wrap plating 4 becomes thick and becomes a thickness (about 0.03 μm or more) at which the gold color comes out, the amount of diffusion of gold becomes large. At the time of soldering of a recent fine pitch product, the concentration of gold in the solder becomes high, and the solder strength is lowered. Accordingly, it is necessary that the gold wrap plating 4 is formed to a thickness of 0.02 μm or less at which the gold color does not come out. That is, when the gold wrap plating 4 is formed to have a thickness in a range of 0.003 μm to 0.02 μm, it covers the nuclei of the palladium strike plating 3, and a drop in solder strength does not occur at the time of soldering. Further, at this thickness of the gold plating, the amount of consumption of gold is small, the productivity of plating is good, and the economy is enhanced.

As the electronic part which is subjected to this surface treatment, the connection terminal as shown in FIG. 2, the connector using connection terminals as shown in FIG. 3, and the metal chassis as shown in FIG. 4 are enumerated, and soldering with excellent solder wettability can be performed for each of them.

Test results of solder wettability of electronic parts subjected to the surface treatment as stated above are excellent as shown in FIGS. 6 and 7.

FIG. 6 shows that according to the judgment by zero crossing time of a meniscograph method, with respect to an electronic part subjected to Ni+Pd-st (strike)+Au gold wrap treatment which is the treatment method of the invention, solder wettability is 1 second or less and is excellent.

FIG. 7 shows that according to the judgment by zero crossing time of the meniscograph method, with respect to an electronic part subjected to Ni+Pd-st (strike)+Au gold wrap treatment which is the treatment method of the invention, when the thickness of Au gold wrap plating is 30, 50, 100 and 200 angstrom, the solder wettability is 1 second or less and is excellent.

The bonding strength in the case where soldering is performed using solder of Sn—Ag—Cu and Sn—Ag—Bi—Cu is also excellent.

According to embodiment 1, since the metal base material of the electronic part to be soldered is sequentially subjected to the surface treatment by the nickel plating, palladium strike plating, and gold wrap plating, there is an effect that the electronic part is obtained which is lead-free, has excellent solder wettability, uses a small amount of gold, and is economical.

Next, the foregoing surface treatment method for the electronic part will be specifically described.

As described above, when the nickel plating 2 having a thickness of 1 to 3 μm, the palladium strike plating 3 (palladium strike) having a thickness of 0.007 to 0.1 μm, and the gold wrap plating 4 (gold plating) having a thickness of 0.003 to 0.02 μm are formed, and the relation of the thickness of the gold wrap plating 4<the thickness of the palladium strike plating 3 is established, the surface treatment with excellent solder wettability can be performed. The formation of the three layers is performed in a manner described below.

First, the base material 1 on which the nickel plating 2 having a thickness of 1 to 3 μm is formed is dipped in a palladium solution prepared to have a concentration lower than a concentration of a normally commercially available one, palladium electrolytic plating is performed under a condition of a current density of 1 to 10 A/dm$^2$, and the palladium strike plating 3 having a thickness of 0.007 to 0.1 μm is formed.

Next, the base material 1 with the palladium strike plating 3 is dipped in a gold solution prepared to have a concentration lower than a concentration of a normally commercially available one, gold electrolytic plating is performed under a condition of a current density of 0.05 to 0.1 A/dm$^2$, and the gold wrap plating 4 having a thickness of 0.003 to 0.02 μm is formed.

The palladium strike plating 3 and the gold wrap plating 4 can be formed by continuously moving the electronic part at constant speed sequentially in a plating line including a palladium bath in which the palladium solution is contained and a gold bath in which the gold solution is contained.

Since the deposition speed is changed according to the solution concentrations of palladium and gold, and the current density, the solution concentrations of palladium and gold are set according to the performance of the line (apparatus) used.

Embodiment 2

In embodiment 1, although the lead-free surface treatment with excellent solder wettability has been described, embodiment 2 relates to a corrosion-resistant treatment which deals with a drop in corrosion resistance due to the thinning of gold wrap plating and improves the corrosion resistance of the gold wrap plating.

FIG. 8 is an explanatory view showing the corrosion-resistant treatment of an electronic part according to embodiment 2 of the invention.

In FIG. 8, a protection film 11 of an anticorrosive agent is formed on a gold wrap plating 4, and seals pin holes 12 of the gold wrap plating.

In embodiment 2, the protection film 11 of the anticorrosive agent is further formed on the gold wrap plating 4. As this protection film 11, a commercially available anticorrosive agent can be used which does not lower the solder wettability of a connection terminal and does not lower contact reliability. The protection film 11 adsorbs on the surface of the gold wrap plating 4, fills the pinholes 12 generated since the gold wrap plating 4 is formed to be thin, and protects the surface of the gold wrap plating 4 against corrosive gas in the atmosphere.

According to embodiment 2, by the protection film of the anticorrosive agent, even if the gold wrap plating is formed to be thin, the corrosion resistance can be made excellent.

What is claimed is:

1. A surface treatment method for a connector-use connecting terminal, the method comprising:

subjecting a soldered part to a three layer surface treatment of nickel, palladium and gold, wherein a palladium layer is electrolytically plated on a nickel layer under a condition where current density is 1 to 10 A/dm$^2$, wherein, after forming the palladium layer, a gold layer is electrolytically plated on the palladium layer under a condition where current density is 0.05 to 0.1 A/dm$^2$, wherein a thickness of the palladium layer is in a range of 0.007 to less than 0.1 μm, a thickness of the gold layer is in a range of 0.003 to less than 0.01 μm, and wherein the thickness of the gold layer is established to be less than the thickness of the palladium layer, and wherein the gold layer partially laps a palladium strike surface which forms the palladium layer.

2. A surface treatment method for a connector-use connecting terminal according to claim 1, wherein a corrosion-resistant protection film is formed on the gold layer.

3. A surface treatment method for a connector-use connecting terminal according to claim 1, wherein the connector-use connecting terminal is moved at constant speed sequentially in a palladium bath in which a palladium solution is contained and a gold bath in which a gold solution is contained, thus forming the palladium layer and the gold layer.

4. The connector-use connecting terminal according to claim 1, wherein an anticorrosive protection film is formed on the gold layer.

5. A connector-use connecting terminal comprising:

a soldered part to be soldered, the soldered part being subjected to a three layer surface treatment of nickel, palladium and gold, wherein a palladium layer and a gold layer are formed such that a thickness of the palladium layer is in a range of 0.007 to less than 0.1 μm, a thickness of the gold layer is in a range of 0.003 to less than 0.01 μm and wherein the thickness of the gold layer is established to be less than the thickness of the palladium layer, and wherein the gold layer partially laps a palladium strike surface which forms the palladium layer.

* * * * *